(12) United States Patent
Tsuruo

(10) Patent No.: US 11,187,601 B2
(45) Date of Patent: Nov. 30, 2021

(54) SENSOR DEVICE

(71) Applicant: JTEKT CORPORATION, Osaka (JP)

(72) Inventor: Hiroto Tsuruo, Okazaki (JP)

(73) Assignee: JTEKT CORPORATION, Osaka (JP)

( * ) Notice: Subject to any disclaimer, the term of this patent is extended or adjusted under 35 U.S.C. 154(b) by 191 days.

(21) Appl. No.: 16/531,227

(22) Filed: Aug. 5, 2019

(65) Prior Publication Data

US 2020/0049577 A1    Feb. 13, 2020

(30) Foreign Application Priority Data

Aug. 9, 2018   (JP) .............................. JP2018-150736

(51) Int. Cl.
*H05K 5/02*    (2006.01)
*H05K 5/06*    (2006.01)
*G01L 3/10*    (2006.01)

(52) U.S. Cl.
CPC ............ *G01L 3/104* (2013.01); *H05K 5/0247* (2013.01); *H05K 5/065* (2013.01)

(58) Field of Classification Search
CPC .............................. H05K 5/0247; H05K 5/065
See application file for complete search history.

(56) References Cited

U.S. PATENT DOCUMENTS

| 2003/0167857 A1* | 9/2003 | Sugimura ............... G01L 3/104 |
|---|---|---|
| | | 73/862.333 |
| 2015/0033877 A1 | 2/2015 | Hotta et al. |
| 2015/0282362 A1 | 10/2015 | Nuriya et al. |
| 2017/0336276 A1 | 11/2017 | Toyama et al. |
| 2018/0143092 A1 | 5/2018 | Hotta et al. |

FOREIGN PATENT DOCUMENTS

JP    2015-191995 A    11/2015

OTHER PUBLICATIONS

Jan. 10, 2020 Extended European Search Report issued in European Patent Application No. 19190575.1.

* cited by examiner

*Primary Examiner* — Hung V Ngo
(74) *Attorney, Agent, or Firm* — Oliff PLC

(57) ABSTRACT

A sensor device that can suppress deformation of a holder due to a molding pressure applied during injection molding of a housing is provided. A second magnetism collection portion holder has a suppression portion that projects from a second holder body portion toward a first holder and that suppresses deformation of the holder due to the molding pressure applied during the injection molding. The distal end surface of the suppression portion abuts against the inner surface of a first holder body portion with the first holder and a second holder assembled to each other with a sensor unit interposed therebetween.

5 Claims, 6 Drawing Sheets

WIDTH DIRECTION
FIRST DIRECTION ←→ SECOND DIRECTION

WIDTH DIRECTION
FIRST DIRECTION ←→ SECOND DIRECTION

SENSOR DEVICE

INCORPORATION BY REFERENCE

The disclosure of Japanese Patent Application No. 2018-150736 filed on Aug. 9, 2018 including the specification, drawings and abstract, is incorporated herein by reference in its entirety.

BACKGROUND OF THE INVENTION

1. Field of the Invention

The present invention relates to a sensor device.

2. Description of the Related Art

Japanese Patent Application Publication No. 2015-191995 (JP 2015-191995 A) discloses a device in which a circuit board on which an electronic component is mounted is surrounded by a holder and a housing is formed by injection molding so as to cover the holder.

In the device according to JP 2015-191995 A, the holder may be deformed by a molding pressure applied during the injection molding of the housing. In the case where the holder is deformed, the deformed holder may contact the electronic component. If the deformed holder contacts the electronic component, the electronic component may be detached from the circuit board. In such a case, electrical connection between the electronic component and a circuit of the circuit board may become poor.

SUMMARY OF THE INVENTION

It is an object of the present invention to provide a sensor device that can suppress deformation of a holder due to a molding pressure applied during injection molding of a housing.

An aspect of the present invention provides a sensor device including: a holder that surrounds a circuit member, to which an electronic component is electrically connected, and a sensor element electrically connected to the circuit member; and a housing formed by injection molding so as to cover the holder. In the sensor device, a suppression portion is provided inside the holder. The suppression portion extends in a column shape so as to connect between inner portions of the holder in a direction of deformation of the holder due to a molding pressure during the injection molding in order to suppress the deformation.

With the configuration described above, in the case where the molding pressure during the injection molding of the housing acts on the holder, the suppression portion that is provided inside the holder engages to suppress deformation of the holder due to the molding pressure during the injection molding. This suppresses contact of the deformed holder with the circuit member. Therefore, it is possible to suppress separation of the electronic component from the circuit member due to such contact, and to suppress electrical connection between the circuit member and the sensor element becoming poor.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
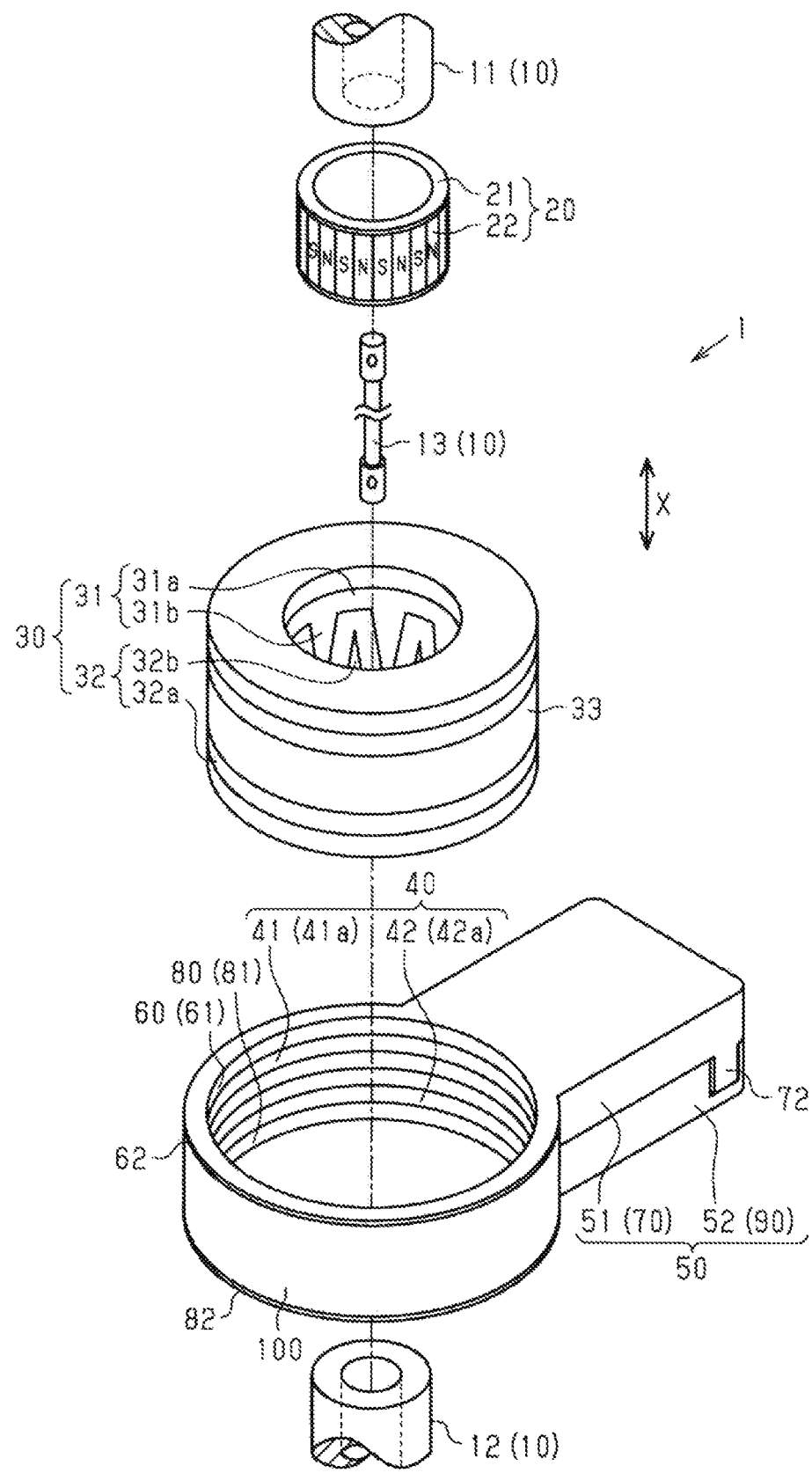
FIG. 1 is an exploded perspective view illustrating the configuration of a torque sensor according to a first embodiment.
Figure 2:
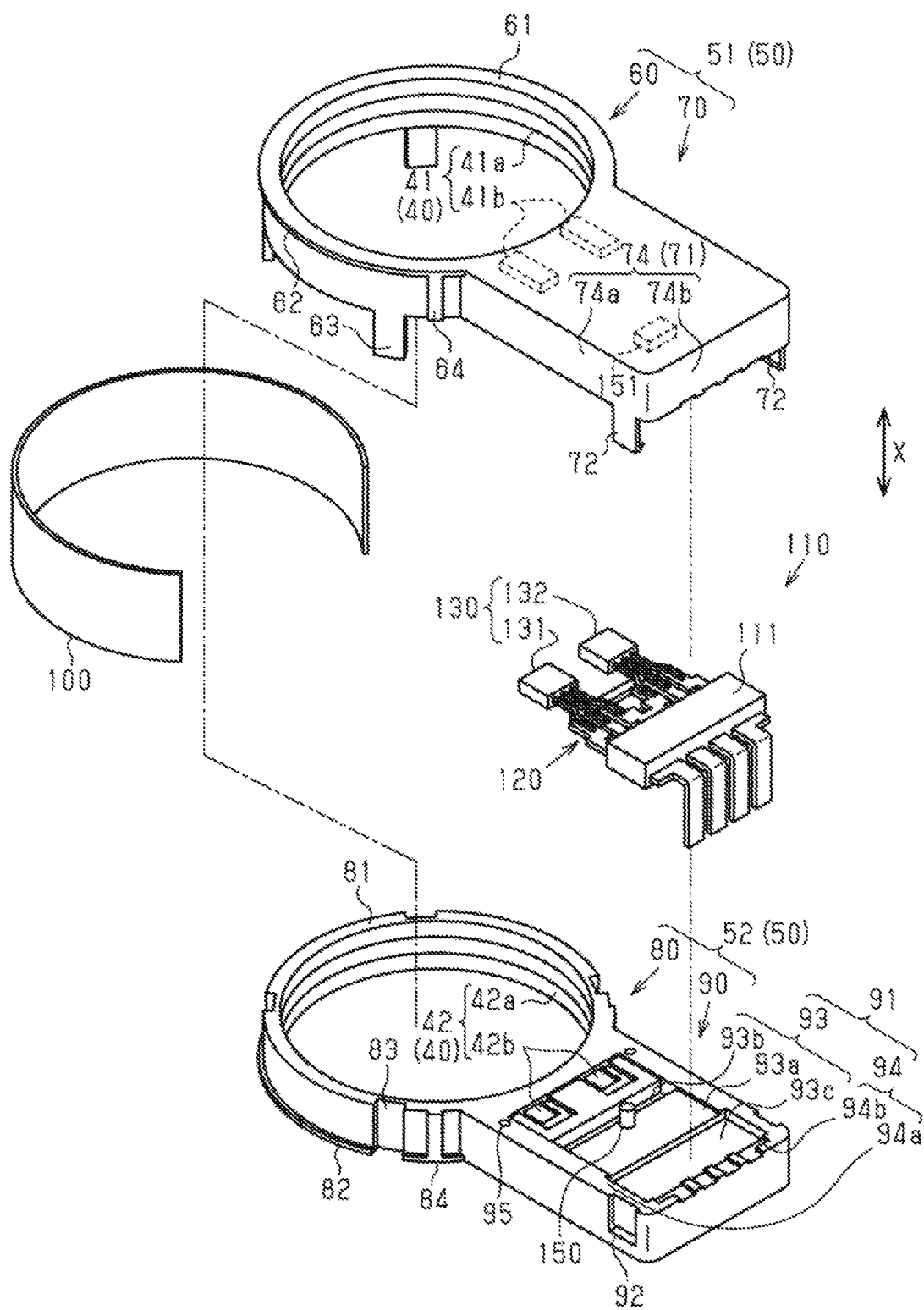
FIG. 2 is an exploded perspective view of a magnetism collection ring, a holder, a sensor unit, and a magnetic shield of the torque sensor according to the first embodiment.

A torque sensor as a first embodiment of a sensor device according to the present invention will be described below. As illustrated in FIGS. 1 and 2, a torque sensor 1 includes a torsion bar 13, a cylindrical permanent magnet 20, a cylindrical magnetic yoke 30, a cylindrical magnetism collection ring 40 disposed so as to surround the magnetic yoke 30, a holder 50 that holds the magnetism collection ring 40, a magnetic shield 100 that covers the outer periphery of the holder 50, and a sensor unit 110. The torque sensor 1 detects torque applied to a rotary shaft 10 such as a steering shaft.

The rotary shaft 10 has an input shaft 11 that serves as a first shaft, an output shaft 12 that serves as a second shaft, and the torsion bar 13 that serves as a coupling shaft. The torsion bar 13 is disposed between the input shaft 11 and the output shaft 12. The input shaft 11 and the output shaft 12 are coupled to each other on the same axis via the torsion bar 13.

The permanent magnet 20 is coupled to the input shaft 11. The permanent magnet 20 has a cylindrical holding portion 21 and a multipole magnet 22. The holding portion 21 is externally fitted with an end portion of the input shaft 11 on the output shaft 12 side. The holding portion 21 is attached so as to be rotatable together with the input shaft 11. The multipole magnet 22 is attached to the outer peripheral surface of the holding portion 21. The multipole magnet 22 is structured such that N and S magnetic poles are disposed alternately in the circumferential direction of the holding portion 21.

The magnetic yoke 30 is coupled to the output shaft 12. The magnetic yoke 30 has an annular first magnetic yoke 31 and an annular second magnetic yoke 32. The first magnetic yoke 31 and the second magnetic yoke 32 are disposed coaxially with the output shaft 12, and fixed so as to be rotatable together with the output shaft 12. The first magnetic yoke 31 and the second magnetic yoke 32 are disposed around the multipole magnet 22 via a predetermined clearance therefrom. The first magnetic yoke 31 and the second magnetic yoke 32 are disposed in a magnetic field formed by the multipole magnet 22. The first magnetic yoke 31 and the second magnetic yoke 32 are disposed so as to face each other with a predetermined clearance therebetween in an axial direction X. The axial direction X is the axial direction of the output shaft 12, and is parallel to the axis of the input shaft 11 and the output shaft 12. The first magnetic yoke 31 has an annular first annular portion 31*a* and a plurality of first lug portions 31b that extend toward the second magnetic yoke 32 from the inner peripheral surface of the first annular portion 31a. The first lug portions 31b are disposed at equal intervals in the circumferential direction on the inner peripheral surface of the first annular portion 31a. The second magnetic yoke 32 has an annular second annular portion 32a and a plurality of second lug portions 32b that extend toward the first magnetic yoke 31 from the inner peripheral surface of the second annular portion 32a. The second lug portions 32b are disposed at equal intervals in the circumferential direction on the inner peripheral surface of the second annular portion 32a. The first magnetic yoke 31 and the second magnetic yoke 32 are molded in a synthetic resin body 33 with the first lug portions 31b and the second lug portions 32b displaced from each other by a constant distance in the circumferential direction. The inner peripheral surfaces of the first magnetic yoke 31 and the second magnetic yoke 32 are exposed from the synthetic resin body 33. The outer peripheral surfaces of the first annular portion 31a and the second annular portion 32a are exposed from the synthetic resin body 33. The first magnetic yoke 31 and the second magnetic yoke 32 are constituted of a magnetic material.

In a neutral state in which the torsion bar 13 between the input shaft 11 and the output shaft 12 is not twisted, the distal ends of the first lug portions 31b of the first magnetic yoke 31 and the distal ends of the second lug portions 32b of the second magnetic yoke 32 point to the boundary between the N poles and the S poles of the multipole magnet 22 of the permanent magnet 20.

The magnetism collection ring 40 has an annular first magnetism collection ring 41 that guides and collects magnetic flux of the first magnetic yoke 31, and an annular second magnetism collection ring 42 that guides and collects magnetic flux of the second magnetic yoke 32. The first magnetism collection ring 41 and the second magnetism collection ring 42 are disposed side by side with a predetermined clearance therebetween in the axial direction X. The first magnetism collection ring 41 and the second magnetism collection ring 42 are constituted of a magnetic material.

The first magnetism collection ring 41 has a first ring portion 41a disposed at the outer periphery of the first magnetic yoke 31 with a predetermined clearance therefrom so as to surround the first magnetic yoke 31, and first magnetism collection portions 41b that extend toward the radially outer side of the first ring portion 41a.

The second magnetism collection ring 42 has a second ring portion 42a disposed at the outer periphery of the second magnetic yoke 32 with a predetermined clearance therefrom so as to surround the second magnetic yoke 32, and second magnetism collection portions 42b that extend toward the radially outer side of the second ring portion 42a.

When the first magnetism collection ring 41 is disposed at the outer periphery of the first magnetic yoke 31 and the second magnetism collection ring 42 is disposed at the outer periphery of the second magnetic yoke 32, the first magnetism collection portions 41b and the second magnetism collection portions 42b are disposed so as to face each other with a predetermined clearance therebetween in the axial direction X.

The holder 50 has a first holder 51 that holds the first magnetism collection ring 41, and a second holder 52 that holds the second magnetism collection ring 42. The first holder 51 and the second holder 52 are disposed side by side in the axial direction X. The holder 50 is constituted by assembling the first holder 51 and the second holder 52 to each other.

The first holder 51 has a first ring portion holder 60 that surrounds and holds the first ring portion 41a, and a first magnetism collection portion holder 70 that surrounds and holds the first magnetism collection portions 41b. The first magnetism collection portion holder 70 extends radially outward from the first ring portion holder 60. The first ring portion holder 60 and the first magnetism collection portion holder 70 are molded integrally with each other. The first ring portion holder 60 and the first magnetism collection portion holder 70 are constituted of a synthetic resin.

The first ring portion holder 60 has a generally cylindrical shape so as to surround the first ring portion 41a. The first ring portion holder 60 has a first circumferential surface portion 61. The outer peripheral surface of the first circumferential surface portion 61 is a circumferential surface. A first flange portion 62 that projects radially outward is provided on the outer side surface of the first circumferential surface portion 61. The first flange portion 62 is provided at a portion of the outer side surface of the first circumferential surface portion 61 on the opposite side from the second holder 52. The first ring portion holder 60 is provided with four first fitting projecting portions 63 that project from a surface of the first ring portion holder 60 on the second holder 52 side toward the second holder 52. The first fitting projecting portions 63 are provided at predetermined intervals from each other in the circumferential direction of the first ring portion holder 60. The first fitting projecting portions 63 serve as lugs for snap fitting. The outer side surface of the first ring portion holder 60 is provided with two first holding portions 64 that project radially outward and in which recesses are formed. The first holding portions 64 are provided at positions that are proximate to the first magnetism collection portion holder 70 in the circumferential direction of the first ring portion holder 60.

The first magnetism collection portion holder 70 has a rectangular plate shape. The first magnetism collection portion holder 70 is connected to a portion of the outer peripheral surface of the first ring portion holder 60 on the second holder 52 side. The longitudinal direction of the first magnetism collection portion holder 70 coincides with the direction in which the first magnetism collection portions 41b extend. The first magnetism collection portion holder 70 has a first holder body portion 71 that faces the second holder 52. A surface of the first holder body portion 71 on the opposite side from the second holder 52 is positioned to be flush with a surface of the first ring portion holder 60 on the opposite side from the second holder 52. The thickness, in the axial direction X, of the first holder body portion 71 of the first magnetism collection portion holder 70 is set to be about the same as the thickness, in the axial direction X, of the first circumferential surface portion 61 of the first ring portion holder 60. The first magnetism collection portion holder 70 is provided with second fitting projecting portions 72 that project toward the second holder 52 with respect to a surface of the first holder body portion 71 on the second holder 52 side. The second fitting projecting portions 72 are provided on the distal end side of the first holder body portion 71. The second fitting projecting portions 72 are provided at both end portions of the first holder body portion 71 in a direction that is orthogonal to the direction in which the first magnetism collection portion holder 70 extends. The second fitting projecting portions 72 serve as lugs for snap fitting.

The second holder 52 has a second ring portion holder 80 that surrounds and holds the second ring portion 42a, and a second magnetism collection portion holder 90 that surrounds and holds the second magnetism collection portions 42b. The second magnetism collection portion holder 90 extends radially outward from the second ring portion holder 80. The second ring portion holder 80 and the second magnetism collection portion holder 90 are molded integrally with each other. The second ring portion holder 80 and the second magnetism collection portion holder 90 are constituted of a synthetic resin.

The second ring portion holder 80 has a generally cylindrical shape so as to surround the second magnetism collection ring 42. The second ring portion holder 80 has a second circumferential surface portion 81. The outer peripheral surface of the second circumferential surface is a circumferential surface. A second flange portion 82 that projects radially outward is provided on the outer side surface of the second circumferential surface portion 81. The second flange portion 82 is provided at a portion of the outer side surface of the second circumferential surface portion 81 on the opposite side from the first holder 51. Four first fitting recessed portions 83 are provided in the outer peripheral surface of the second ring portion holder 80. The first fitting recessed portions 83 are formed to be recessed over the entire region, in the axial direction, of the second ring portion holder 80. The first fitting recessed portions 83 are provided at predetermined intervals from each other in the circumferential direction of the second ring portion holder 80. The outer peripheral surface of the second ring portion holder 80 is provided with two second holding portions 84 that project radially outward and in which recesses are formed. The second holding portions 84 are provided at positions that are proximate to the second magnetism collection portion holder 90 in the circumferential direction of the second ring portion holder 80.

The magnetic shield 100 is disposed on the outer circumferential side of the first ring portion holder 60 and the second ring portion holder 80 with the first holder 51 and the second holder 52 assembled to each other. The magnetic shield 100 is formed in a C-shape in cross section. A material that can block magnetism such as metal, for example, is adopted for the magnetic shield 100. The magnetic shield 100 abuts against the first flange portion 62 of the first ring portion holder 60 and the second flange portion 82 of the second ring portion holder 80 in the axial direction X. Both end portions, in the circumferential direction, of the magnetic shield 100 are inserted into the first holding portions 64 and the second holding portions 84 to be held.

The second magnetism collection portion holder 90 has a rectangular plate shape. The second magnetism collection portion holder 90 is connected to the outer peripheral surface of the second ring portion holder 80. The second magnetism collection portion holder 90 is disposed so as to face the first magnetism collection portion holder 70 in the axial direction X. The longitudinal direction of the second magnetism collection portion holder 90 coincides with the direction in which the second magnetism collection portions 42b extend. The second magnetism collection portion holder 90 has a second holder body portion 91. A surface of the second holder body portion 91 on the opposite side from the first holder 51 is positioned to be flush with a surface of the second ring portion holder 80 on the opposite side from the first ring portion holder 60. The thickness, in the axial direction X, of the second holder body portion 91 of the second magnetism collection portion holder 90 is set to be about the same as the thickness, in the axial direction X, of the second circumferential surface portion 81 of the second ring portion holder 80. The second holder body portion 91 has second fitting recessed portions 92 to be fitted with the second fitting projecting portions 72. The second fitting recessed portions 92 are positioned on the distal end side of the second holder body portion 91, and provided at portions of the outer side surface of the second holder body portion 91 on the opposite side from the first holder 51. The second holder body portion 91 has a placement portion 93 for placement of the sensor unit 110, and a side wall 94. The placement portion 93 is formed to be recessed with respect to the side wall 94.

Figure 3:
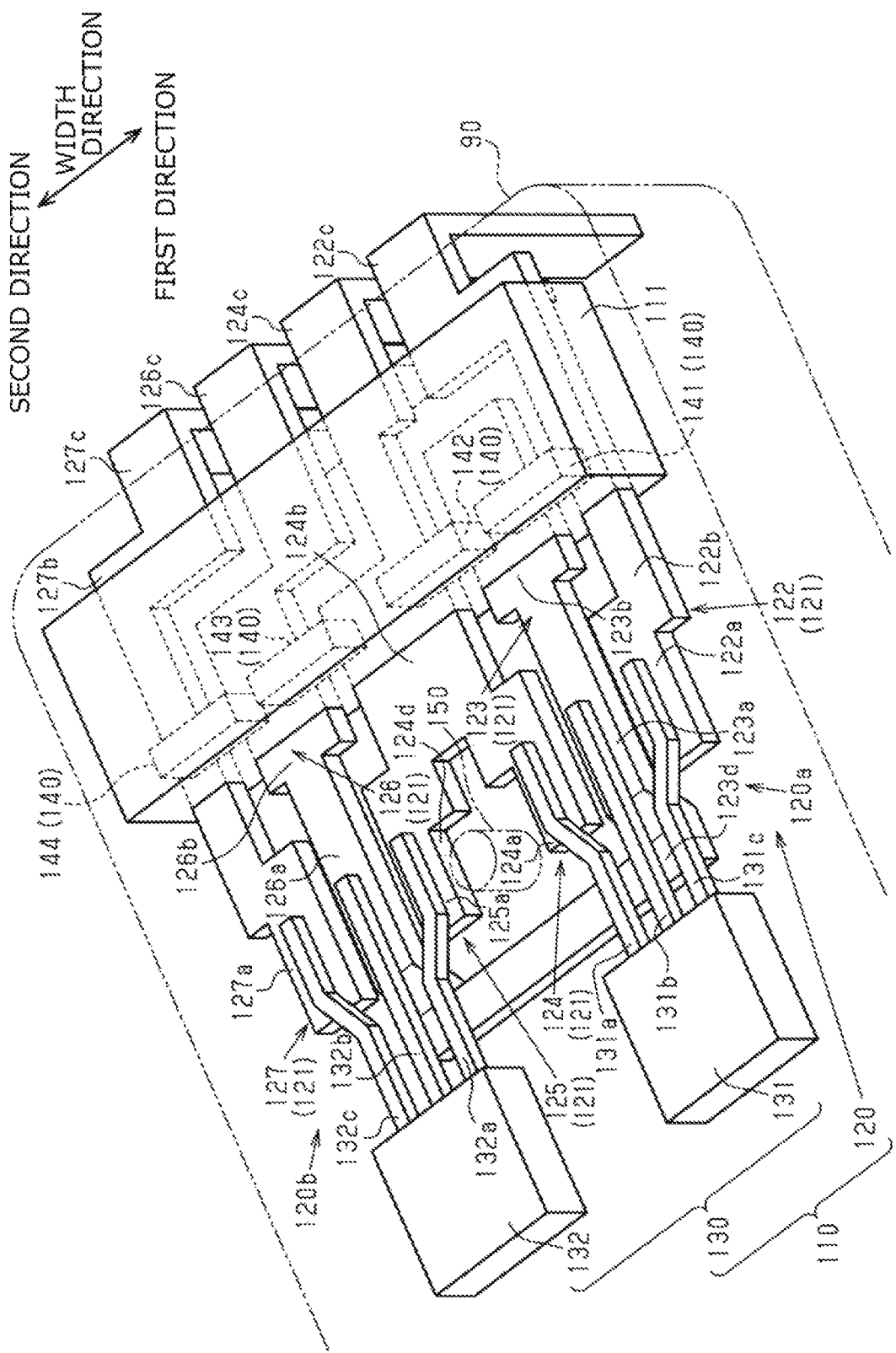
FIG. 3 is a perspective view of a circuit member and a sensor element of the torque sensor according to the first embodiment.
Figure 4:
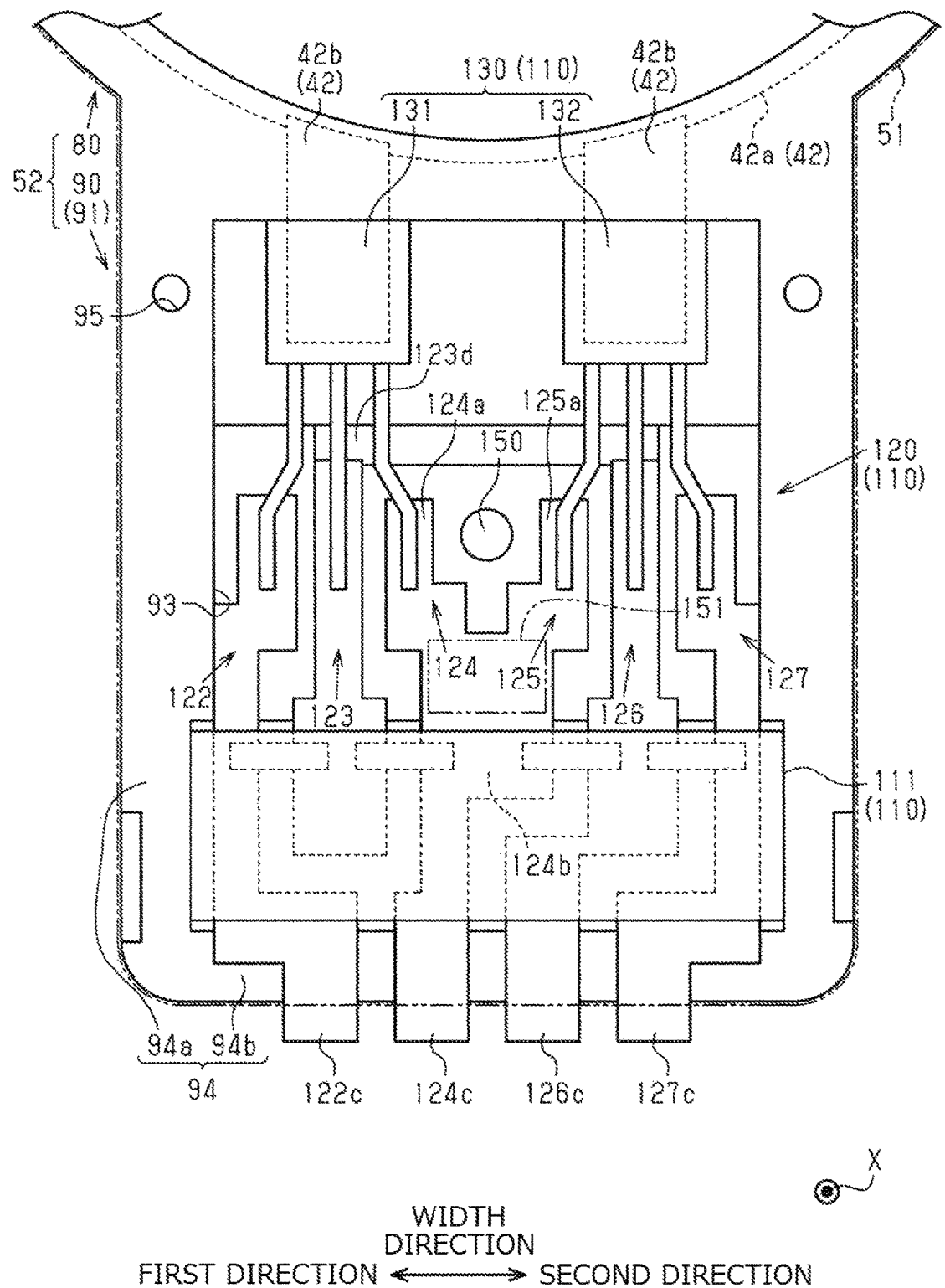
FIG. 4 is a top view of a second magnetism collection portion holder of the torque sensor according to the first embodiment.
Figure 5:
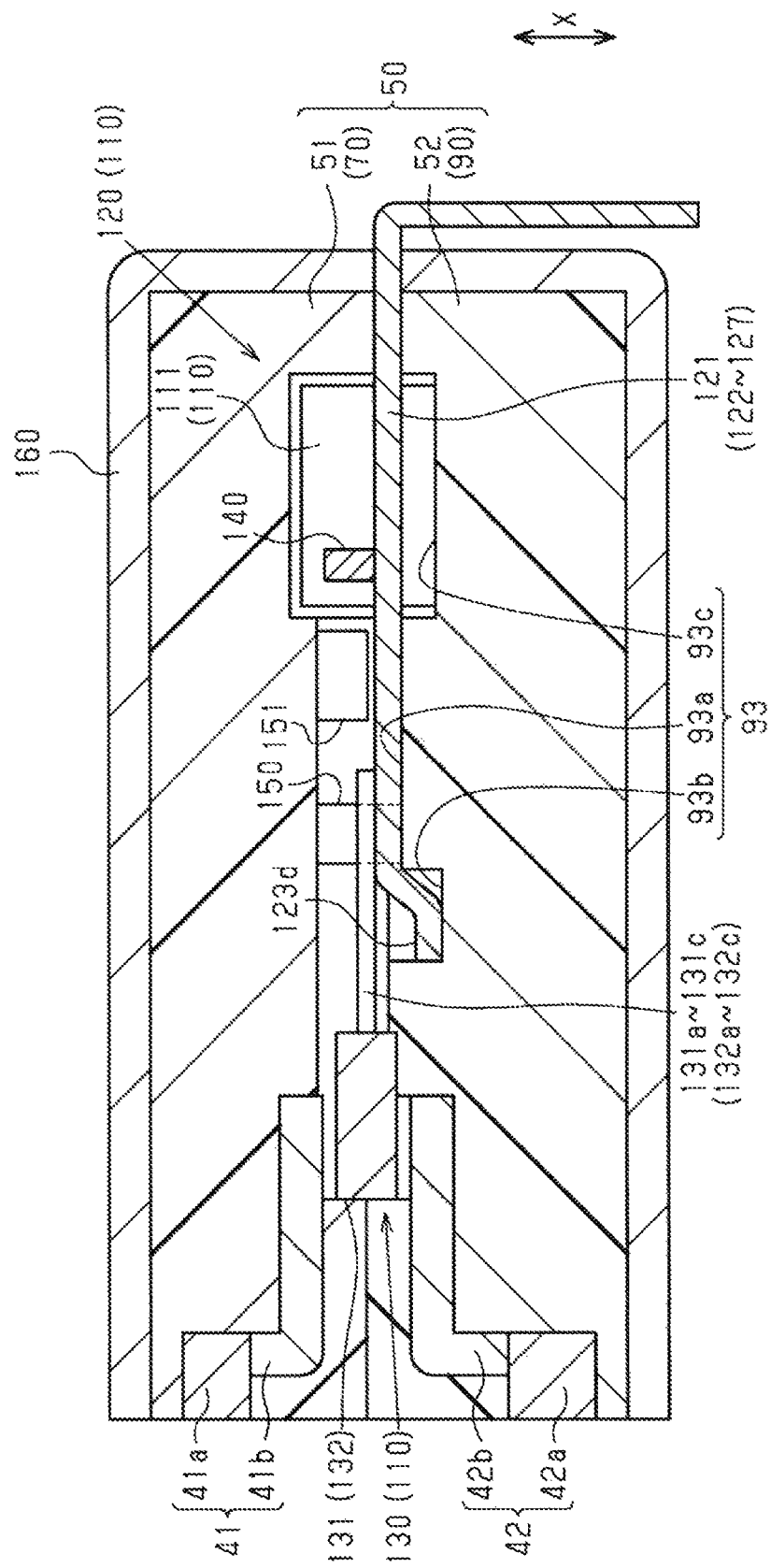
FIG. 5 is a sectional view of a magnetism collection portion holder of the torque sensor according to the first embodiment.

The sensor unit 110 will be described. As illustrated in FIGS. 3 to 5, the sensor unit 110 has a circuit member 120 and a sensor element 130 connected to the circuit member 120. The sensor element 130 has a rectangular parallelepiped shape. A magnetism detection element such as a Hall element, for example, is adopted as the sensor element 130. In the present embodiment, the sensor element 130 is provided with a first sensor element 131 and a second sensor element 132 provided redundantly. The first sensor element 131 and the second sensor element 132 are disposed side by side with each other in a direction (hereinafter referred to as a "width direction") that is orthogonal to the direction in which the second magnetism collection portion holder 90 extends. The first magnetism collection ring 41 is provided with two first magnetism collection portions 41b. The second magnetism collection ring 42 is provided with two second magnetism collection portions 42b. The first magnetism collection portions 41b are exposed at an end portion of the first magnetism collection portion holder 70 on the first ring portion holder 60 side. The second magnetism collection portions 42b are exposed at an end portion of the second magnetism collection portion holder 90 on the second ring portion holder 80 side. The first sensor element 131 and the second sensor element 132 are disposed between the first magnetism collection portions 41b and the second magnetism collection portions 42b with the first holder 51 and the second holder 52 assembled to each other. The first sensor element 131 has three terminals, namely a first power source terminal 131a, a first ground terminal 131b, and a first signal terminal 131c, which are arranged in this order in the direction (hereinafter referred to as a "first direction") from the second sensor element 132 toward the first sensor element 131. The first power source terminal 131a, the first ground terminal 131b, and the first signal terminal 131c extend toward the respective distal ends thereof in the direction in which the second magnetism collection portion holder 90 extends with the first sensor element 131 assembled to the second holder 52. The second sensor element 132 has three terminals, namely a second power source terminal 132a, a second ground terminal 132b, and a second signal terminal 132c, which are arranged in this order in the direction (hereinafter referred to as a "second direction") from the first sensor element 131 toward the second sensor element 132. The second power source terminal 132a, the second ground terminal 132b, and the second signal terminal 132c extend toward the respective distal ends thereof in the direction in which the second magnetism collection portion holder 90 extends with the second sensor element 132 assembled to the second holder 52.

The circuit member 120 has a plate-shaped conductor portion 121 that is energizable and an electronic component 140. The conductor portion 121 is a bus bar constituted of a metal material. The conductor portion 121 of the circuit member 120 has six conductor portions, namely a first conductor portion 122, a second conductor portion 123, a third conductor portion 124, a fourth conductor portion 125, a fifth conductor portion 126, and a sixth conductor portion 127, which are arranged in this order in the second direction. The first conductor portion 122, the second conductor portion 123, the third conductor portion 124, the fourth conductor portion 125, the fifth conductor portion 126, and the sixth conductor portion 127 are disposed side by side with a clearance therebetween in the width direction.

The first conductor portion 122 has a first terminal connection portion 122a, a first intermediate portion 122b, and a first external wiring connection portion 122c, which are arranged in this order toward the distal end in the direction in which the second magnetism collection portion holder 90 extends. The first conductor portion 122 has a crank shape as a whole. The first signal terminal 131c of the first sensor element 131 is electrically connected to the first terminal connection portion 122a by soldering, an adhesive, or the like. The first intermediate portion 122b is continuous with the first terminal connection portion 122a so as to be closer to the first direction than the first terminal connection portion 122a. The first external wiring connection portion 122c is continuous with the first intermediate portion 122b so as to be closer to the second direction than the first terminal connection portion 122a. The first external wiring connection portion 122c is formed to be bent at the distal end portion thereof in the direction in which the second magnetism collection portion holder 90 extends in order to extend in the direction away from the first magnetism collection portion holder 70.

The second conductor portion 123 has a stepped portion 123d, a second terminal connection portion 123a, and a second intermediate portion 123b, which are arranged in this order toward the distal end in the direction in which the second magnetism collection portion holder 90 extends. The first ground terminal 131b of the first sensor element 131 is electrically connected to the second terminal connection portion 123a by soldering, an adhesive, or the like. The second intermediate portion 123b is continuous with the second terminal connection portion 123a, and is widened in the width direction. The stepped portion 123d is disposed away from the first magnetism collection portion holder 70 with respect to the second terminal connection portion 123a and the first sensor element 131. The stepped portion 123d has a rectangular plate shape. The longitudinal direction of the stepped portion 123d coincides with the width direction. An end portion of the stepped portion 123d in the first direction is bent to be continuous with the second terminal connection portion 123a.

The third conductor portion 124 has a third terminal connection portion 124a, a third intermediate portion 124b, and a third external wiring connection portion 124c, which are arranged in this order toward the distal end in the direction in which the second magnetism collection portion holder 90 extends. The fourth conductor portion 125 has a fourth terminal connection portion 125a. The third conductor portion 124 and the fourth conductor portion 125 are disposed on the distal end side, in the direction in which the second magnetism collection portion holder 90 extends, with respect to the stepped portion 123d of the second conductor portion 123. The third terminal connection portion 124a and the fourth terminal connection portion 125a have a generally rectangular shape. The third intermediate portion 124b is continuous with the third terminal connection portion 124a and the fourth terminal connection portion 125a with the third terminal connection portion 124a and the fourth terminal connection portion 125a located away from each other in the width direction. The first power source terminal 131a of the first sensor element 131 is electrically connected to the third terminal connection portion 124a by soldering, an adhesive, or the like. The second power source terminal 132a of the second sensor element 132 is electrically connected to the fourth terminal connection portion 125a by soldering, an adhesive, or the like. The width of the third intermediate portion 124b in the width direction is set to be smaller in the width direction than the distance between an end portion of the third terminal connection portion 124a close to the first direction and an end portion of the fourth terminal connection portion 125a close to the second direction. The third conductor portion 124 and the fourth conductor portion 125 have a notched portion 124d surrounded by a surface of the third terminal connection portion 124a close to the second direction, a surface of the fourth terminal connection portion 125a close to the first direction, and a surface of the third intermediate portion 124b on the second ring portion holder 80 side. The notched portion 124d is formed in a two-stage notched shape in which the notch is narrowed in the width direction toward the distal end in the direction in which the second magnetism collection portion holder 90 extends. The third external wiring connection portion 124c is continuous with the third intermediate portion 124b so as to be at about the same position as the third terminal connection portion 124a in the width direction. The third external wiring connection portion 124c is formed to be bent at the distal end portion thereof in the direction in which the second magnetism collection portion holder 90 extends in order to extend in the direction away from the first magnetism collection portion holder 70.

The fifth conductor portion 126 has a fifth terminal connection portion 126a, a fifth intermediate portion 126b, and a fifth external wiring connection portion 126c, which are arranged in this order toward the distal end in the direction in which the second magnetism collection portion holder 90 extends. The fifth conductor portion 126 has a crank shape as a whole. The second ground terminal 132b of the second sensor element 132 is electrically connected to the fifth terminal connection portion 126a by soldering, an adhesive, or the like. An end portion of the stepped portion 123d in the second direction is bent to be continuous with the fifth terminal connection portion 126a. The stepped portion 123d is disposed away from the first magnetism collection portion holder 70 with respect to the fifth terminal connection portion 126a and the second sensor element 132. The fifth intermediate portion 126b is continuous with the fifth terminal connection portion 126a, and is widened in the width direction. The fifth external wiring connection portion 126c is continuous with the fifth intermediate portion 126b so as to be closer to the first direction than the fifth terminal connection portion 126a. The fifth external wiring connection portion 126c is formed to be bent at the distal end portion thereof in the direction in which the second magnetism collection portion holder 90 extends in order to extend in the direction away from the first magnetism collection portion holder 70.

The sixth conductor portion 127 has a sixth terminal connection portion 127a, a sixth intermediate portion 127b, and a sixth external wiring connection portion 127c, which are arranged in this order toward the distal end in the direction in which the second magnetism collection portion holder 90 extends. The sixth conductor portion 127 has a crank shape as a whole. The second signal terminal 132c of the second sensor element 132 is electrically connected to the sixth terminal connection portion 127a by soldering, an adhesive, or the like. The sixth intermediate portion 127b is continuous with the sixth terminal connection portion 127*a* so as to be closer to the second direction than the sixth terminal connection portion 127*a*. The sixth external wiring connection portion 127*c* is continuous with the sixth intermediate portion 127*b* so as to be closer to the first direction than the sixth intermediate portion 127*b*. The sixth external wiring connection portion 127*c* is formed to be bent at the distal end portion thereof in the direction in which the second magnetism collection portion holder 90 extends in order to extend in the direction away from the first magnetism collection portion holder 70.

Thus, four external wiring connection portions, namely the first external wiring connection portion 122*c*, the third external wiring connection portion 124*c*, the fifth external wiring connection portion 126*c*, and the sixth external wiring connection portion 127*c*, are arranged in this order in the second direction at the distal end portion of the conductor portion 121 in the direction in which the second magnetism collection portion holder 90 extends, and disposed side by side with a clearance therebetween in the width direction.

The sensor unit 110 has a cover portion 111 that couples the first conductor portion 122, the second conductor portion 123, the third conductor portion 124, the fourth conductor portion 125, the fifth conductor portion 126, and the sixth conductor portion 127. The cover portion 111 is constituted of a synthetic resin. The cover portion 111 has a rectangular parallelepiped shape so as to cover the first intermediate portion 122*b*, the second intermediate portion 123*b*, the third intermediate portion 124*b*, the fifth intermediate portion 126*b*, and the sixth intermediate portion 127*b*. The longitudinal direction of the cover portion 111 corresponds to the width direction.

The electronic component 140 is provided inside the cover portion 111. In the present embodiment, a capacitor etc. is adopted as the electronic component 140. The electronic component 140 has a first electronic component 141, a second electronic component 142, a third electronic component 143, and a fourth electronic component 144, which are arranged in this order in the second direction. The first electronic component 141 is disposed so as to extend between the first intermediate portion 122*b* of the first conductor portion 122 and the second intermediate portion 123*b* of the second conductor portion 123. The first electronic component 141 is electrically connected to the first intermediate portion 122*b* and the second intermediate portion 123*b*. The second electronic component 142 is disposed so as to extend between the second intermediate portion 123*b* of the second conductor portion 123 and the third intermediate portion 124*b* of the third conductor portion 124. The second electronic component 142 is electrically connected to the second intermediate portion 123*b* and the third intermediate portion 124*b*. The third electronic component 143 is disposed so as to extend between the third intermediate portion 124*b* of the third conductor portion 124 and the fifth intermediate portion 126*b* of the fifth conductor portion 126. The third electronic component 143 is electrically connected to the third intermediate portion 124*b* and the fifth intermediate portion 126*b*. The fourth electronic component 144 is disposed so as to extend between the fifth intermediate portion 126*b* of the fifth conductor portion 126 and the sixth intermediate portion 127*b* of the sixth conductor portion 127. The fourth electronic component 144 is electrically connected to the fifth intermediate portion 126*b* of the fifth conductor portion 126 and the sixth intermediate portion 127*b*. The first electronic component 141, the second electronic component 142, the third electronic component 143, and the fourth electronic component 144 are covered by the cover portion 111.

The circuit member 120 can be divided into two, namely a first circuit member 120*a* connected to the first sensor element 131 and a second circuit member 120*b* connected to the second sensor element 132. The first circuit member 120*a* is constituted from the first conductor portion 122, the second conductor portion 123, the third terminal connection portion 124*a*, the third intermediate portion 124*b*, and the third external wiring connection portion 124*c* of the third conductor portion 124, the first electronic component 141, the second electronic component 142, and the cover portion 111. The second circuit member 120*b* is constituted from the fourth conductor portion 125, the fifth conductor portion 126, the sixth conductor portion 127, the third intermediate portion 124*b* and the third external wiring connection portion 124*c* of the third conductor portion 124, the third electronic component 143, the fourth electronic component 144, and the cover portion 111.

The second magnetism collection portion holder 90 will be described.

As illustrated in FIGS. 2, 4, and 5, the sensor unit 110 is placed on the placement portion 93. The side wall 94 of the second magnetism collection portion holder 90 separates the internal space, which is formed between the first magnetism collection portion holder 70 and the second magnetism collection portion holder 90, and the outside from each other. The side wall 94 has long side walls 94*a* and a short side wall 94*b* corresponding to the rectangular shape of the second magnetism collection portion holder 90. The long side walls 94*a* are provided at end portions of the second holder body portion 91 in the width direction. The long side walls 94*a* face each other. The short side wall 94*b* is provided at the distal end portion of the second holder body portion 91 in the direction in which the second magnetism collection portion holder 90 extends. The long side walls 94*a* is thicker than the short side wall 94*b*. Holes 95 that extend in the axial direction X are formed at respective end portions of the long side walls 94*a* on the second ring portion holder 80 side. When seen in the axial direction X, the center of the thickness of the long side wall 94*a* in the width direction is positioned on the outer side with respect to the center of the hole 95 in the width direction. The placement portion 93 has a first recessed portion 93*b* and a second recessed portion 93*c* formed to be recessed with respect to a base surface 93*a* formed to be recessed with respect to a surface of the second holder body portion 91 on the first magnetism collection portion holder 70 side. The first recessed portion 93*b* and the second recessed portion 93*c* have a rectangular shape when seen in the axial direction X. The longitudinal direction of the first recessed portion 93*b* and the second recessed portion 93*c* coincides with the width direction. The length, in the width direction, of the first recessed portion 93*b* is set to be shorter than the length, in the width direction, of the second recessed portion 93*c*. When the sensor unit 110 is placed on the placement portion 93, the stepped portion 123*d* of the second conductor portion 123 is placed on the first recessed portion 93*b*, and the cover portion 111 is placed on the second recessed portion 93*c*.

The second magnetism collection portion holder 90 has a suppression portion 150 that projects from the second holder body portion 91 (inside) toward the first holder 51. The suppression portion 150 has a circular column shape. The suppression portion 150 projects toward the first holder 51 with respect to the side wall 94. The distal end surface of the suppression portion 150 abuts against the inner surface of the first holder body portion 71 with the first holder 51 and the second holder 52 assembled to each other with the sensor unit 110 interposed therebetween. The suppression portion 150 is positioned between the third terminal connection portion 124*a* and the fourth terminal connection portion 125*a* in the width direction, and between the third intermediate portion 124*b* and the stepped portion 123*d* in the direction in which the second magnetism collection portion holder 90 extends, with the sensor unit 110 assembled to the second magnetism collection portion holder 90. The suppression portion 150 is disposed with a clearance from the third terminal connection portion 124*a*, the fourth terminal connection portion 125*a*, the third intermediate portion 124*b*, and the stepped portion 123*d*.

The first magnetism collection portion holder 70 has a side wall 74 that separates the internal space and the outside from each other, as with the side wall 94 of the second magnetism collection portion holder 90. The side wall 74 has long side walls 74*a* and a short side wall 74*b*. The first holder 51 and the second holder 52 are assembled to each other with the top surfaces of the long side walls 94*a* of the second magnetism collection portion holder 90 in surface contact with ceiling surfaces connecting to the long side walls 74*a* of the first magnetism collection portion holder 70 and with the top surface of the short side wall 94*b* of the second magnetism collection portion holder 90 in surface contact with a ceiling surface connecting to the short side wall 74*b* of the first magnetism collection portion holder 70.

The first magnetism collection portion holder 70 has a projection portion 151 that projects from the first holder body portion 71 (inside) toward the second holder 52. The projection portion 151 is disposed on the distal end side, in the direction in which the second magnetism collection portion holder 90 extends, with respect to the suppression portion 150. The projection portion 151 faces a portion of the third intermediate portion 124*b* of the third conductor portion 124 that is not covered by the cover portion 111. The projection length of the projection portion 151 from the first holder body portion 71 is set to be shorter than the projection length of the suppression portion 150 from the second holder body portion 91. A clearance is formed between the projection portion 151 and the third intermediate portion 124*b* with the first holder 51 and the second holder 52 assembled to each other with the sensor unit 110 interposed therebetween. A clearance is formed between the cover portion 111 and the first holder body portion 71 with the first holder 51 and the second holder 52 assembled to each other with the sensor unit 110 interposed therebetween.

The first holder 51 and the second holder 52 are assembled to each other with the sensor unit 110 interposed therebetween. In this event, the first fitting projecting portions 63 of the first ring portion holder 60 are fitted with the first fitting recessed portions 83 of the second ring portion holder 80. The second fitting projecting portions 72 of the first magnetism collection portion holder 70 are fitted with the second fitting recessed portions 92 of the second magnetism collection portion holder 90. Consequently, the first holder 51 and the second holder 52 are completely assembled to each other. This assembly is covered by a housing 160 to complete the torque sensor 1.

An injection molding method for the housing 160 will be described. An assembly in which the first holder 51 and the second holder 52 are assembled to each other with the sensor unit 110 interposed therebetween is housed in a die (not illustrated) to be clamped in the die. A molten resin that is melted by being heated is injected into the die from an injection device (not illustrated), and a molding pressure, which is the pressure of the molten resin charged into the die, is kept constant. Consequently, air bubbles etc. that remain in the molten resin are removed. When the molten resin injected into the die is cooled, the molten resin is solidified so as to cover the assembled holder 50. Consequently, the housing 160 is formed by injection molding.

In the thus configured torque sensor 1, when the rotary shaft 10 is rotationally operated, for example, to cause relative rotational displacement between the input shaft 11 and the output shaft 12, the positional relationship of the permanent magnet 20 with the first magnetic yoke 31 and with the second magnetic yoke 32 is varied, and therefore magnetism collected by the first magnetic yoke 31 and the second magnetic yoke 32 is varied. Consequently, magnetic flux that passes between the first magnetism collection portions 41*b* and the second magnetism collection portions 42*b* is varied, and therefore the intensity of magnetism applied to the sensor element 130 is varied. The intensity of magnetism applied to the sensor element 130 is varied in accordance with the torsional angle of the torsion bar 13. Thus, the torsional angle of the torsion bar 13 can be computed on the basis of a detection signal output from the sensor element 130, and therefore torque applied to the rotary shaft 10 can be computed on the basis of the torsional angle of the torsion bar 13.

The functions and the effects of the first embodiment will be described.

(1) During the injection molding of the housing 160, the molding pressure of the molten resin injected into the die acts on the outer surface of the holder 50. The molding pressure occasionally deforms the first holder body portion 71, the second holder body portion 91, and the side wall 94 inward, that is, so as to collapse a space formed inside the holder 50. When the deformed holder 50 contacts the circuit member 120, in particular the electronic component 140, the electronic component 140 may be detached from the conductor portion 121. In the case where the electronic component 140 is detached from the conductor portion 121, electrical connection between the electronic component 140 and the conductor portion 121 becomes poor.

In the first embodiment, in the case where the molding pressure during the injection molding of the housing 160 acts on the holder 50, the suppression portion 150 that is provided inside the holder 50 engages to suppress deformation of the holder 50 due to the molding pressure during the injection molding. This suppresses contact of the deformed holder 50 with the circuit member 120. Therefore, it is possible to suppress separation of the electronic component 140 from the circuit member 120 due to such contact, and to suppress electrical connection between the circuit member 120 and the sensor element 130 becoming poor.

(2) In the case where the molding pressure during the injection molding of the housing 160 acts on the holder 50, the suppression portion 150 that is provided on the second holder body portion 91 of the second holder 52 engages with the first holder body portion 71. Therefore, deformation of the first holder body portion 71 and the second holder body portion 91 can be suppressed. Thus, the circuit member 120 and the sensor element 130 that are placed on the placement portion 93 of the second holder 52 can be protected. The suppression portion 150 is provided on the second holder body portion 91, on which the circuit member 120 and the sensor element 130 are placed. In this case, it is not necessary to pay attention to avoid contact of the suppression portion 150 with the circuit member 120 and the sensor element 130 during assembly of the first holder 51 and the second holder 52. This facilitates assembly between the first holder 51 and the second holder 52.

(3) The suppression portion 150 is disposed between the third terminal connection portion 124a and the fourth terminal connection portion 125a, that is, between the first circuit member 120a and the second circuit member 120b. Therefore, the arrangement of the suppression portion 150 is suitable for suppressing contact of the first holder body portion 71 with the circuit member 120 due to the molding pressure during the injection molding of the housing 160. Interference between the sensor element 130 and the circuit member 120 and the suppression portion 150 is suppressed, since the suppression portion 150 is disposed with a clearance from the circuit member 120, when the circuit member 120 and the sensor element 130 are assembled to the second holder 52.

(4) The projection portion 151 faces a portion of the third intermediate portion 124b of the third conductor portion 124 that is not covered by the cover portion 111. The projection length of the projection portion 151 is set to be shorter than the projection length of the suppression portion 150. Thus, the suppression portion 150 engages with the first holder body portion 71 before the projection portion 151 abuts against and engages with the third intermediate portion 124b. Therefore, the molding pressure during the injection molding of the housing 160 mainly acts on the suppression portion 150 of the second holder 52, which suppresses application of the molding pressure to the circuit member 120.

(5) The first magnetism collection portion holder 70 and the second magnetism collection portion holder 90 have a rectangular shape, and thus the long side walls 94a, which are portions of the side wall 94 that extend in the longitudinal direction, are easily deformable. This is because the section modulus of the side wall 94 in the direction of application of the molding pressure is larger for the long side walls 94a that are large in area and deformed over a long length compared to the short side wall 94b. Therefore, in the case where the molding pressure during the injection molding of the housing 160 acts on the holder, the long side walls 94a positioned in the width direction tend to be significantly affected by the molding pressure. In the first embodiment, the thickness of the side wall 94 is determined such that the long side walls 94a, on which the molding pressure acts significantly, is thicker than the short side wall 94b. Therefore, the effect of the molding pressure during the injection molding of the housing 160 can be suitably suppressed by the first magnetism collection portion holder 70 and the second magnetism collection portion holder 90.

Second Embodiment

A torque sensor according to a second embodiment will be described. Differences from the first embodiment will be mainly described.

Figure 6:
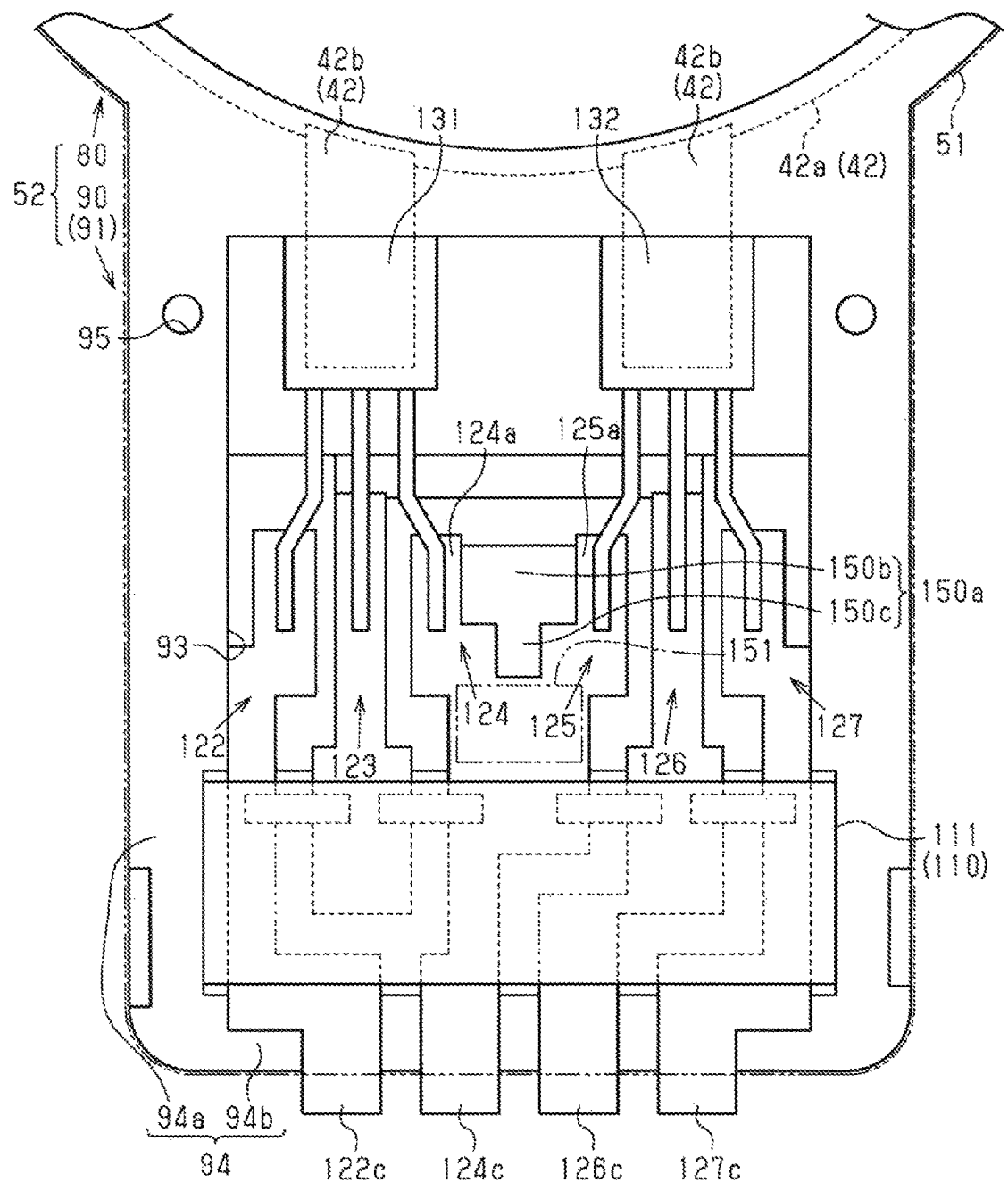
FIG. 6 is a top view of a magnetism collection portion holder of a torque sensor according to a second embodiment.

As illustrated in FIG. 6, the second magnetism collection portion holder 90 has a suppression portion 150a that projects from the second holder body portion 91 toward the first holder 51. The suppression portion 150a has a shape in which two rectangular columns in different shapes are molded integrally with each other. The suppression portion 150a has a first rectangular column portion 150b and a second rectangular column portion 150c. The second rectangular column portion 150c is positioned on the distal end side, in the direction in which the second magnetism collection portion holder 90 extends, with respect to the first rectangular column portion 150b. The projection length, in the axial direction X, of the first rectangular column portion 150b from the second holder body portion 91 is set to be equal to the projection length, in the axial direction X, of the second rectangular column portion 150c from the second holder body portion 91. The second rectangular column portion 150c is formed to be smaller in the width direction and smaller in the direction in which the second magnetism collection portion holder 90 extends than the first rectangular column portion 150b. The suppression portion 150a is disposed between the third terminal connection portion 124a and the fourth terminal connection portion 125a. The first rectangular column portion 150b abuts against the third terminal connection portion 124a and the fourth terminal connection portion 125a at a wide portion between the third terminal connection portion 124a and the fourth terminal connection portion 125a. The second rectangular column portion 150c abuts against the third terminal connection portion 124a and the fourth terminal connection portion 125a at a portion that is narrow in the width direction between the third terminal connection portion 124a and the fourth terminal connection portion 125a. The suppression portion 150a contacts the third terminal connection portion 124a and the fourth terminal connection portion 125a in the width direction with the sensor unit 110 assembled to the second magnetism collection portion holder 90.

The functions and the effects of the second embodiment will be described.

(6) The suppression portion 150a is disposed between the third terminal connection portion 124a and the fourth terminal connection portion 125a, that is, between the first circuit member 120a and the second circuit member 120b. Therefore, the position of assembly of the circuit member 120 and the sensor element 130 can be prescribed with reference to the suppression portion 150a when the circuit member 120 and the sensor element 130 are assembled to the second holder 52. This allows the circuit member 120 and the sensor element 130 to be positioned with respect to the second holder 52 using the suppression portion 150a.

The embodiments may be modified as follows. The following other embodiments may be combined with each other as long as the embodiments do not technically contradict with each other. The thickness of the long side walls 94a may be set to be equal to the thickness of the short side wall 94b. The thickness of the long side walls 94a may be set to be smaller than the thickness of the short side wall 94b.

The longitudinal direction of the first magnetism collection portion holder 70 may be orthogonal to the direction in which the first magnetism collection portions 41b extend. The longitudinal direction of the second magnetism collection portion holder 90 may be orthogonal to the direction in which the second magnetism collection portions 42b extend.

The projection length of the suppression portion 150 may be equal to the projection length of the projection portion 151. The projection length of the suppression portion 150a may be equal to the projection length of the projection portion 151. The projection portion 151 may not be provided.

The sensor element 130 includes the first sensor element 131 and the second sensor element 132 that are provided redundantly. However, only the first sensor element 131 may be provided as the sensor element 130. Alternatively, the sensor element 130 may be provided with three or more sensor elements.

The suppression portion 150 is positioned between the first circuit member 120a and the second circuit member 120b, that is, between the third terminal connection portion 124a and the fourth terminal connection portion 125a in the width direction, and between the third intermediate portion 124b and the stepped portion 123d in the direction in which the second magnetism collection portion holder 90 extends. However, the present invention is not limited thereto. For example, the suppression portion 150 may be provided at a portion of the placement portion 93 of the second magnetism collection portion holder 90 on the outer side of the circuit member 120. The suppression portion 150a is positioned between the first circuit member 120a and the second circuit member 120b, that is, between the third terminal connection portion 124a and the fourth terminal connection portion 125a in the width direction, and between the third intermediate portion 124b and the stepped portion 123d in the direction in which the second magnetism collection portion holder 90 extends. However, the present invention is not limited thereto. For example, the suppression portion 150a may be provided at a portion of the placement portion 93 of the second magnetism collection portion holder 90 on the outer side of the circuit member 120.

The suppression portion 150 projects from the second holder body portion 91 toward the first holder 51. However, the present invention is not limited thereto. For example, the suppression portion 150 may project from the first holder body portion 71 toward the second holder 52. The suppression portion 150a may project from the first holder body portion 71 toward the second holder 52.

A clearance may be formed in the axial direction X between the suppression portion 150 and the first holder body portion 71 with the first holder 51 and the second holder 52 assembled to each other with the sensor unit 110 interposed therebetween.

The holder 50 is constituted from the first holder 51 and the second holder 52. However, the holder 50 may be constituted from three or more holders. The suppression portion 150 is provided integrally with the second holder body portion 91. However, the suppression portion 150 may be provided separately therefrom. The suppression portion 150a may be provided separately from the second holder body portion 91.

The suppression portion 150 may have a polygonal column shape such as a rectangular column shape, for example. The suppression portion 150 may be provided so as to contact the third terminal connection portion 124a and the fourth terminal connection portion 125a in the width direction.

The suppression portion 150a may be disposed with a clearance from the third terminal connection portion 124a and the fourth terminal connection portion 125a. While a hall element is adopted as the sensor element 130, a magnetoresistance element may be adopted.

While the sensor device is embodied as the torque sensor 1 that detects torque, the sensor device may be embodied as a rotational angle detection device that detects the rotational angle of the rotary shaft 10, for example.

What is claimed is:

1. A sensor device comprising:
a holder that surrounds a circuit member, to which an electronic component is electrically connected, and a sensor element electrically connected to the circuit member; and
a housing formed by injection molding so as to cover the holder, wherein:
a suppression portion is provided inside the holder, the suppression portion extending in a column shape so as to connect between inner portions of the holder in a direction of deformation of the holder due to a molding pressure during the injection molding in order to suppress the deformation;
the holder is constituted from at least a first holder and a second holder, and surrounds the circuit member and the sensor element between the first holder and the second holder;
the first holder has a first holder body portion; and
the second holder has a second holder body portion that includes a placement portion, on which the circuit member and the sensor element are placed, and that faces the first holder body portion, and the suppression portion that projects from the second holder body portion toward the first holder body portion.

2. The sensor device according to claim 1, wherein:
the sensor element includes a first sensor element and a second sensor element;
the circuit member includes a first circuit member electrically connected to the first sensor element and a second circuit member electrically connected to the second sensor element; and
the suppression portion is disposed between the first circuit member and the second circuit member with a clearance from the first circuit member and the second circuit member.

3. The sensor device according to claim 1, wherein:
the sensor element includes a first sensor element and a second sensor element;
the circuit member includes a first circuit member electrically connected to the first sensor element and a second circuit member electrically connected to the second sensor element; and
the suppression portion is disposed between the first circuit member and the second circuit member in abutment with the first circuit member and the second circuit member.

4. The sensor device according to claim 1, wherein:
the circuit member includes the electronic component and a conductor portion that is energizable;
the first holder has a projection portion that projects from the first holder body portion toward the second holder and that faces the conductor portion; and
a projection length of the suppression portion is set to be longer than a projection length of the projection portion.

5. A sensor device comprising:
a holder that surrounds a circuit member, to which an electronic component is electrically connected, and a sensor element electrically connected to the circuit member;
a housing formed by injection molding so as to cover the holder, wherein a suppression portion is provided inside the holder, the suppression portion extending in a column shape so as to connect between inner portions of the holder in a direction of deformation of the holder due to a molding pressure during the injection molding in order to suppress the deformation;
a permanent magnet attached to a first shaft and magnetized in a circumferential direction;
a magnetic yoke that is fixed to a second shaft coupled to the first shaft via a coupling shaft and is disposed in a magnetic field formed by the permanent magnet; and
a magnetism collection ring disposed so as to surround the magnetic yoke and configured to collect magnetic flux of the magnetic yoke, wherein:

the magnetism collection ring has an annular ring portion that surrounds the magnetic yoke and a magnetism collection portion that extends toward a radially outer side of the ring portion;

the holder has a magnetism collection portion holder that surrounds the magnetism collection portion, the sensor element, and the circuit member and that has a rectangular shape when seen in an axial direction of the second shaft;

a longitudinal direction of the magnetism collection portion holder coincides with a direction in which the magnetism collection portion extends, and a short-length direction of the magnetism collection portion holder coincides with a direction that is orthogonal to the direction in which the magnetism collection portion extends; and the magnetism collection portion holder is provided with a side wall that separates an inside and an outside of the magnetism collection portion holder, and a long side wall of the side wall is set to be thicker than a short side wall of the side wall.

\* \* \* \* \*